(12) United States Patent
Hassanzadeh et al.

(10) Patent No.: US 10,535,934 B1
(45) Date of Patent: Jan. 14, 2020

(54) APPARATUS, SYSTEM, AND METHOD FOR ACHIEVING PCB-COMPATIBLE POWER SOCKETS

(71) Applicant: Juniper Networks, Inc., Sunnyvale, CA (US)

(72) Inventors: Aliaskar Hassanzadeh, Fremont, CA (US); Darron L. Holley, Morgan Hill, CA (US); Franklin D. Boyden, Pleasanton, CA (US)

(73) Assignee: Juniper Networks, Inc., Sunnyvale, CA (US)

( * ) Notice: Subject to any disclaimer, the term of this patent is extended or adjusted under 35 U.S.C. 154(b) by 0 days.

(21) Appl. No.: 15/963,434

(22) Filed: Apr. 26, 2018

(51) Int. Cl.
*H01R 12/00* (2006.01)
*H01R 12/70* (2011.01)
*H05K 1/18* (2006.01)
*H01R 43/20* (2006.01)

(52) U.S. Cl.
CPC ..... *H01R 12/7047* (2013.01); *H01R 12/7088* (2013.01); *H01R 43/205* (2013.01); *H05K 1/184* (2013.01); *H05K 2201/10272* (2013.01); *H05K 2201/10295* (2013.01); *H05K 2201/10325* (2013.01); *H05K 2201/10333* (2013.01); *H05K 2201/10409* (2013.01)

(58) Field of Classification Search
CPC ....... H01R 23/725; H01R 9/097; H01R 9/096
USPC ...... 439/74, 65, 75, 78; 361/434; 174/138 D
See application file for complete search history.

(56) References Cited

U.S. PATENT DOCUMENTS

| | | | |
|---|---|---|---|
| 3,189,864 A * | 6/1965 | Angele | H01R 43/24 29/597 |
| 6,618,268 B2 * | 9/2003 | Dibene, II | G06F 1/18 174/261 |
| 9,698,535 B2 * | 7/2017 | Cornelius | H01R 13/665 |

* cited by examiner

Primary Examiner — Phuong Chi Thi Nguyen
(74) Attorney, Agent, or Firm — FisherBroyles, LLP (57) ABSTRACT

The disclosed apparatus may include may include (1) a power socket receptacle that (A) fits within a via of a circuit board and (B) is inserted into the circuit board through one side of the via and (2) a power socket plug that (A) fits within the power socket receptacle and (B) is screwed into the power socket receptacle through another side of the via such that the power socket receptacle and the power socket plug collectively provide electrical continuity across the via. Various other apparatuses, systems, and methods are also disclosed.

9 Claims, 10 Drawing Sheets

APPARATUS, SYSTEM, AND METHOD FOR ACHIEVING PCB-COMPATIBLE POWER SOCKETS

In high-technology devices, Printed Circuit Boards (PCBs) often include numerous conductive layers that are separated by dielectric material. Such PCBs may also include vias that provide electrical continuity across certain layers despite being separated by the dielectric material. For example, a PCB may include a via that serves as a conductive path between traces etched into different layers. As a result of the via, these traces may carry that same electrical signal throughout different layers of the PCB.

In some cases, vias may be plated with conductive material that electrically bridges the different layers of the PCBs during the etching phase of production. In other cases, vias may remain unplated after the etching phase of production such that additional conductive material is needed to electrically bridge the different layers of the PCB. Either way, some PCBs may be designed to incorporate power sockets that fit within vias and enable the PCBs to interface with and/or attach to a power bus.

Unfortunately, traditional power sockets may have certain shortcomings and/or deficiencies that effectively limit their usage in and/or compatibility with PCBs. For example, installation of a traditional power socket may necessitate enough force to damage and/or harm the structural and/or electrical integrity of the corresponding PCB, thereby potentially leading to a failure and/or an electrical short. Additionally or alternatively, a traditional power socket may necessitate very tight and/or restrictive tolerances that are costly, difficult, and/or impossible to achieve during fabrication of the PCB.

The instant disclosure, therefore, identifies and addresses a need for additional and improved apparatuses, systems, and methods for achieving PCB-compatible power sockets.

SUMMARY

As will be described in greater detail below, the instant disclosure generally relates to apparatuses, systems, and methods for achieving PCB-compatible power sockets. In one example, an apparatus for accomplishing such a task may include (1) a power socket receptacle that (A) fits within a via of a circuit board and (B) is inserted into the circuit board through one side of the via and (2) a power socket plug that (A) fits within the power socket receptacle and (B) is screwed into the power socket receptacle through another side of the via such that the power socket receptacle and the power socket plug collectively provide electrical continuity across the via.

Similarly, a system incorporating the above-described apparatus may include (1) a circuit board that includes at least one via, (2) a power socket receptacle that (A) fits within the via of the circuit board and (B) is inserted into the circuit board through one side of the via, and (3) a power socket plug that (A) fits within the power socket receptacle and (B) is screwed into the power socket receptacle through another side of the via such that the power socket receptacle and the power socket plug collectively provide electrical continuity across the via.

A corresponding method may include (1) inserting a power socket receptacle into one side of a via of a circuit board, (2) screwing a threaded power socket plug into the power socket receptacle through another side of the via such that the power socket receptacle and the power socket plug collectively provide electrical continuity across (A) the via and (B) a plurality of electrically conductive layers that interface with one another at the via, and (3) inserting, into the power socket receptacle, a power pin coupled to a power bus bar to facilitate transfer of electrical power from the power bus bar to the circuit board by way of the via.

Features from any of the above-mentioned embodiments may be used in combination with one another in accordance with the general principles described herein. These and other embodiments, features, and advantages will be more fully understood upon reading the following detailed description in conjunction with the accompanying drawings and claims.

BRIEF DESCRIPTION OF THE DRAWINGS

The accompanying drawings illustrate a number of exemplary embodiments and are a part of the specification. Together with the following description, these drawings demonstrate and explain various principles of the instant disclosure.

Throughout the drawings, identical reference characters and descriptions indicate similar, but not necessarily identical, elements. While the exemplary embodiments described herein are susceptible to various modifications and alternative forms, specific embodiments have been shown by way of example in the drawings and will be described in detail herein. However, the exemplary embodiments described herein are not intended to be limited to the particular forms disclosed. Rather, the instant disclosure covers all modifications, equivalents, and alternatives falling within the scope of the appended claims.

DETAILED DESCRIPTION OF EXEMPLARY EMBODIMENTS

The present disclosure describes various apparatuses, systems, and methods for achieving PCB-compatible power sockets. In some examples, a PCB-compatible power socket may include a receptacle and a plug that interface with and/or attach to one another by way of a screw and/or thread mechanism. For example, a power socket receptacle may be inserted into a PCB through one side of a via, and a power socket plug may be screwed into the power socket receptacle through the opposite side of the via. This screw and/or thread mechanism may enable the receptacle and plug to join as a power socket through the via on the PCB without necessitating the same amount of force as traditional power sockets (such as press-fit power sockets). As a result, this screw and/or thread mechanism may mitigate and/or decrease the risk of damaging the structural and/or electrical integrity of the PCB and/or the risk of causing a short circuit.

Additionally or alternatively, this screw and/or thread mechanism may mitigate and/or negate the need for the same tight and/or restrictive tolerances required by traditional power sockets (such as press-fit power sockets). As a result, this screw and/or thread mechanism may facilitate an easier, more cost-effective process for assembling and/or installing the power socket in the PCB when compared to traditional processes.

The following will provide, with reference to FIGS. 1-9, detailed descriptions of exemplary apparatuses, systems, and/or implementations for achieving PCB-compatible power sockets. Finally, the discussion corresponding to FIG. 10 will provide a detailed description of an exemplary method for achieving PCB-compatible power sockets.

Figure 1:
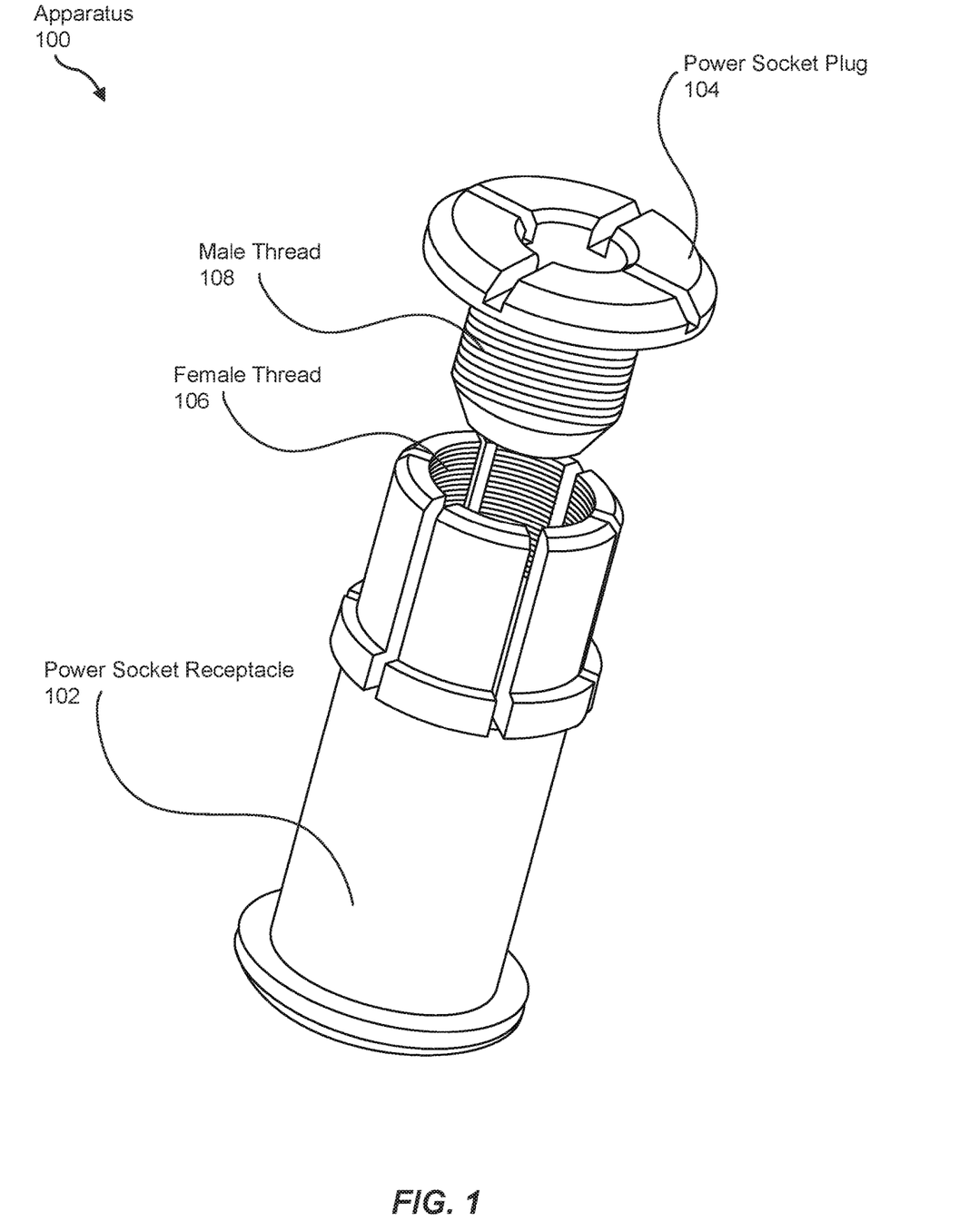
FIG. 1 is an illustration of an exemplary apparatus for achieving PCB-compatible power sockets.

FIG. 1 illustrates an exemplary apparatus 100 for achieving PCB-compatible power sockets. As illustrated in FIG. 1, exemplary apparatus 100 may include and/or represent a power socket receptacle 102 and a power socket plug 104. In one example, power socket receptacle 102 may include and/or represent a fixture, fitting, and/or insert that fits, at least partially, within and/or through a via on a circuit board. In this example, power socket receptacle 102 may be designed to mate and/or interface with power socket plug 104 by way of a screw and/or thread fastener.

In some examples, power socket receptacle 102 may include and/or incorporate a head that fits within and/or through a via on a PCB. In one example, the head of power socket receptacle 102 may be somewhat malleable and/or bendable to support and/or account for certain tolerance variations of the corresponding via. The head of power socket receptacle 102 may include and/or form one or more incisions and/or notches to facilitate such malleability and/or bendability.

In some examples, power socket receptacle 102 may provide electrical continuity across various electrically conductive layers of a PCB (not illustrated in FIG. 1). Power socket receptacle 102 may include and/or contain a variety of materials. Some of these materials may conduct electricity. Examples of such electrically conductive materials include, without limitation, copper, aluminum, silver, gold, alloys of one or more of the same, combinations or variations of one or more of the same, and/or any other suitable materials.

Other materials included and/or contained in power socket receptacle 102 may be non-conductive and/or insulative. Examples of such non-conductive and/or insulative materials include, without limitation, plastics, ceramics, polymers, composites, rubbers, combinations or variations of one or more of the same, and/or any other suitable materials.

Power socket receptacle 102 may be of various shapes and/or dimensions. In some examples, at least a portion of the outer body of power socket receptacle 102 may be round, cylindrical, and/or tubular to fit within and/or through a round via. In other examples, at least a portion of the outer body of power socket receptacle 102 may be square and/or rectangular to fit within and/or through a square and/or rectangular via. In short, the outer body of power socket receptacle 102 may be of any suitable shape and/or size to fit within and/or through a corresponding via.

In some examples, power socket receptacle 102 may include and/or form an opening designed to accept and/or hold a power pin (not illustrated in FIG. 1). In one example, this opening may be round, cylindrical, and/or tubular. In other examples, this opening may be square and/or rectangular. In short, this opening may be of any suitable shape and/or size to accept and/or hold a corresponding power pin.

In one example, power socket plug 104 may include and/or represent a fixture, fitting, and/or insert that fits, at least partially, within and/or through a receptacle installed in a via on a circuit board. In this example, power socket plug 104 may be designed to mate and/or interface with power socket receptacle 102 by way of a screw and/or thread fastener.

Power socket plug 104 may be of various shapes and/or dimensions. In some examples, power socket plug 104 may include and/or incorporate a body that fits within and/or through at least a portion of power socket receptacle 102 installed in a PCB. In one example, the body of power socket plug 104 may be somewhat malleable and/or bendable to support and/or account for certain tolerance variations of power socket receptacle 102.

Power socket plug 104 may include and/or contain a variety of materials. Some of these materials may conduct electricity. Examples of such electrically conductive materials include, without limitation, copper, aluminum, silver, gold, alloys of one or more of the same, combinations or variations of one or more of the same, and/or any other suitable materials.

Other materials included and/or contained in power socket plug 104 may be non-conductive and/or insulative. Examples of such non-conductive and/or insulative materials include, without limitation, plastics, ceramics, polymers, composites, rubbers, combinations or variations of one or more of the same, and/or any other suitable materials.

As illustrated in FIG. 1, power socket receptacle 102 may include a female thread 106. In one example, female thread 106 may envelop the inner diameter of the head of power socket receptacle 102. In this example, female thread 106 may be designed to mate, fasten, and/or join with male threading on power socket plug 104. Female thread 106 may be of any suitable shape and/or size to facilitate fastening to the male threading on power socket plug 104.

As further illustrated in FIG. 1, power socket plug 104 may include a male thread 108. In one example, male thread 108 may envelop the body of power socket plug 104. In this example, male thread 108 may be designed to mate, fasten, and/or join with female thread 106 on power socket receptacle 102. Male thread 108 may be of any suitable shape and/or size to facilitate fastening to the female thread 106 on power socket receptacle 102.

Although FIG. 1 illustrates an embodiment that involves female threading on power socket receptacle 102 and male threading on power socket plug 104, alternative embodiments may switch and/or swap the threading styles or genders. For example, contrary to the embodiment illustrated in FIG. 1, power socket receptacle 102 may include and/or incorporate male thread 108, and power socket plug 104 may include and/or incorporate female thread 106. Either way, the combination of female thread 106 and male thread 108 may facilitate fastening power socket receptacle 102 and power socket plug 104 by screwing one into the other via rotation, twisting, and/or torque.

In some examples, power socket plug 104 may be equipped with a gripping mechanism that enables a human technician to simply rotate, twist, and/or screw power socket plug 104 manually and/or by hand (using, e.g., his or her fingers). In other examples, power socket plug 104 may be fitted to accept a certain tool with which a human technician and/or robotic device is able to rotate, twist, and/or screw power socket plug 104. For example, power socket plug 104 may be fitted for a screwdriver (such as a Phillips or flat head). Additionally or alternatively, power socket plug 104 may be fitted for a specific drill bit.

Figure 2:
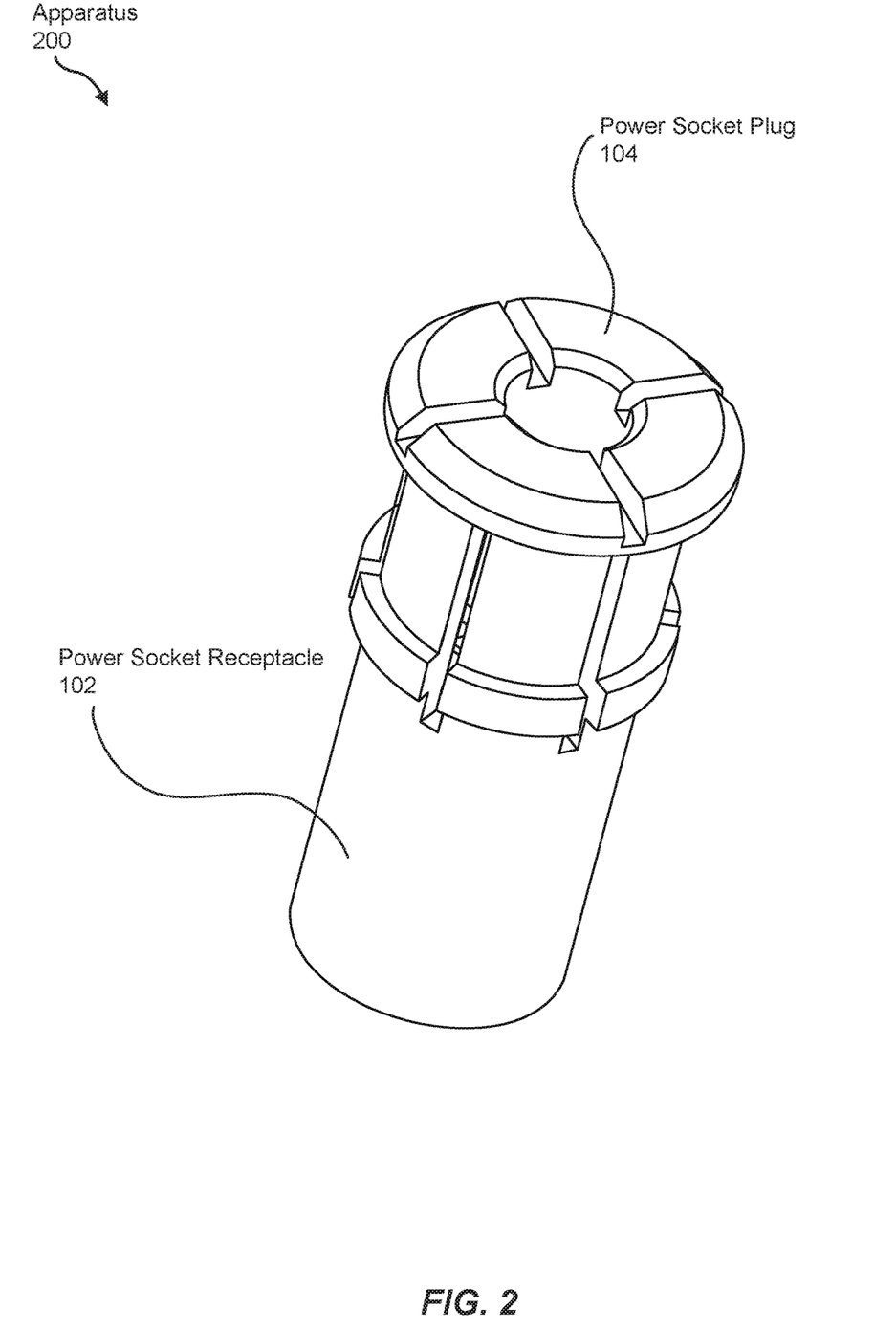
FIG. 2 is an illustration of an exemplary apparatus for achieving PCB-compatible power sockets.

FIG. 2 illustrates an exemplary apparatus 200 for achieving PCB-compatible power sockets. As illustrated in FIG. 2, exemplary apparatus 200 may include and/or represent power socket receptacle 102 and power socket plug 104 fastened together by way of female thread 106 and male thread 108 (not visible in FIG. 2). In this example, the body of power socket plug 104 may be inserted and/or installed into power socket receptacle 102. Accordingly, apparatus 200 may represent and/or demonstrate a power socket in which power socket plug 104 has been screwed into power socket receptacle 102.

Figure 3:
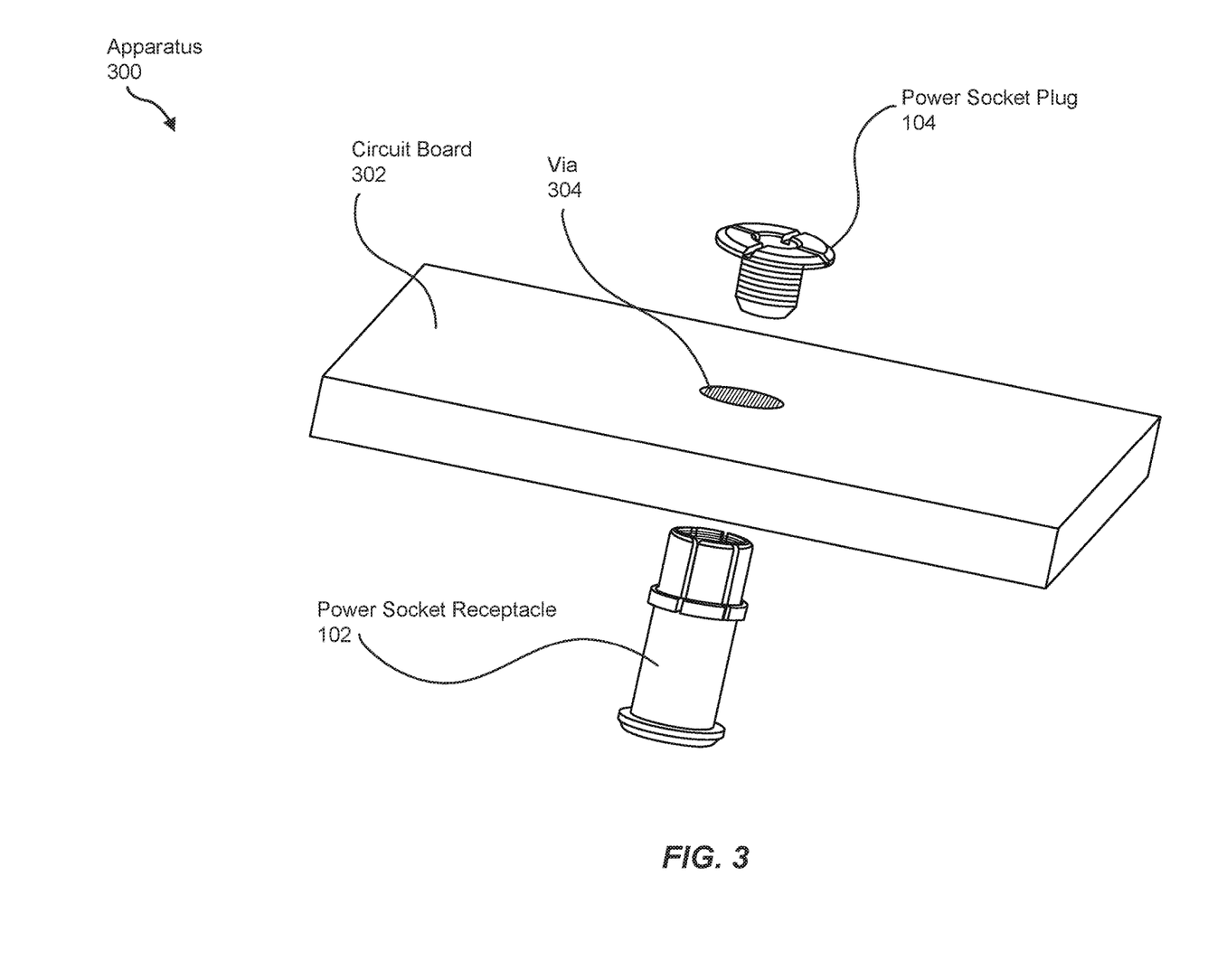
FIG. 3 is an illustration of an exemplary apparatus for achieving PCB-compatible power sockets.
Figure 4:
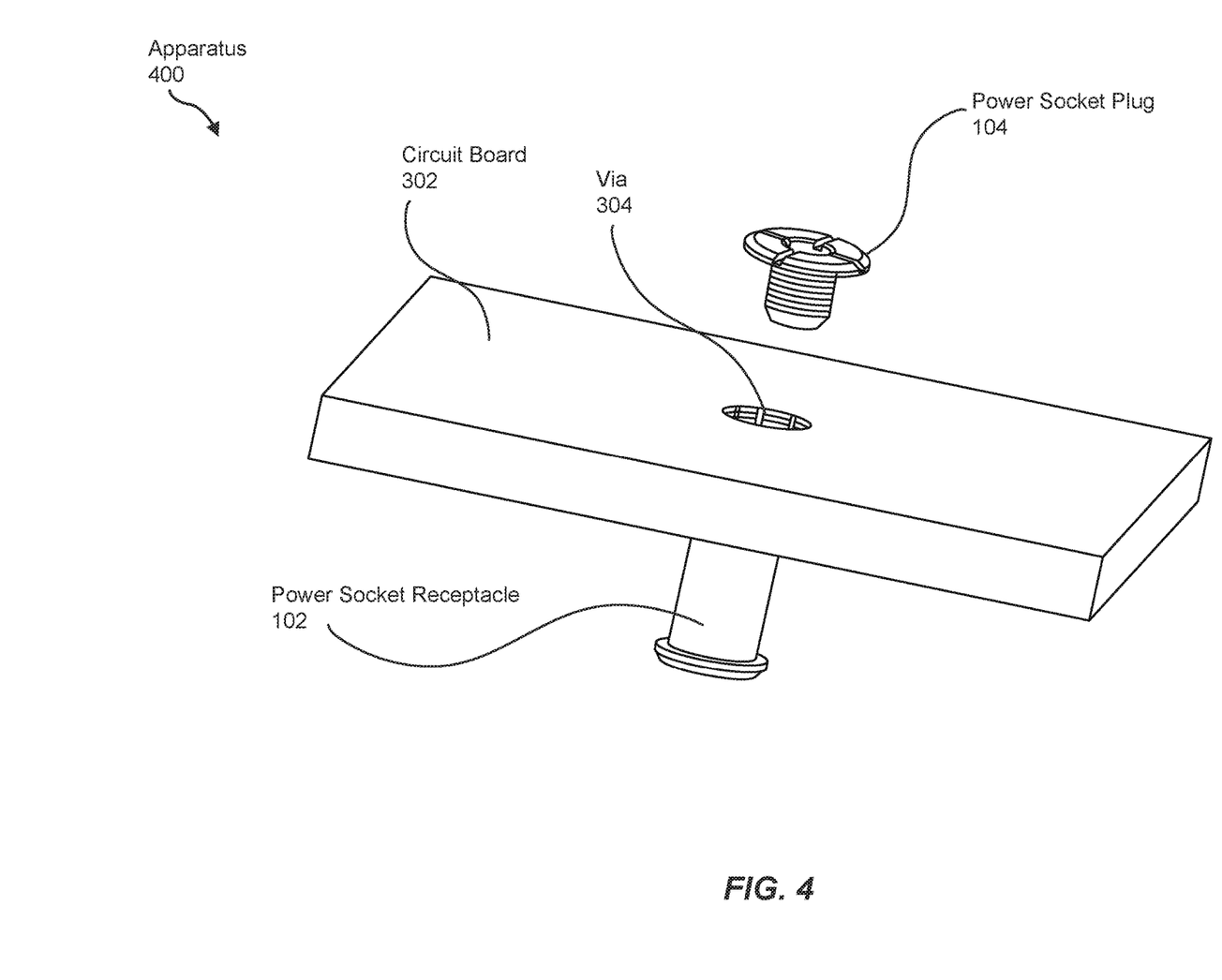
FIG. 4 is an illustration of an exemplary apparatus for achieving PCB-compatible power sockets.
Figure 5:
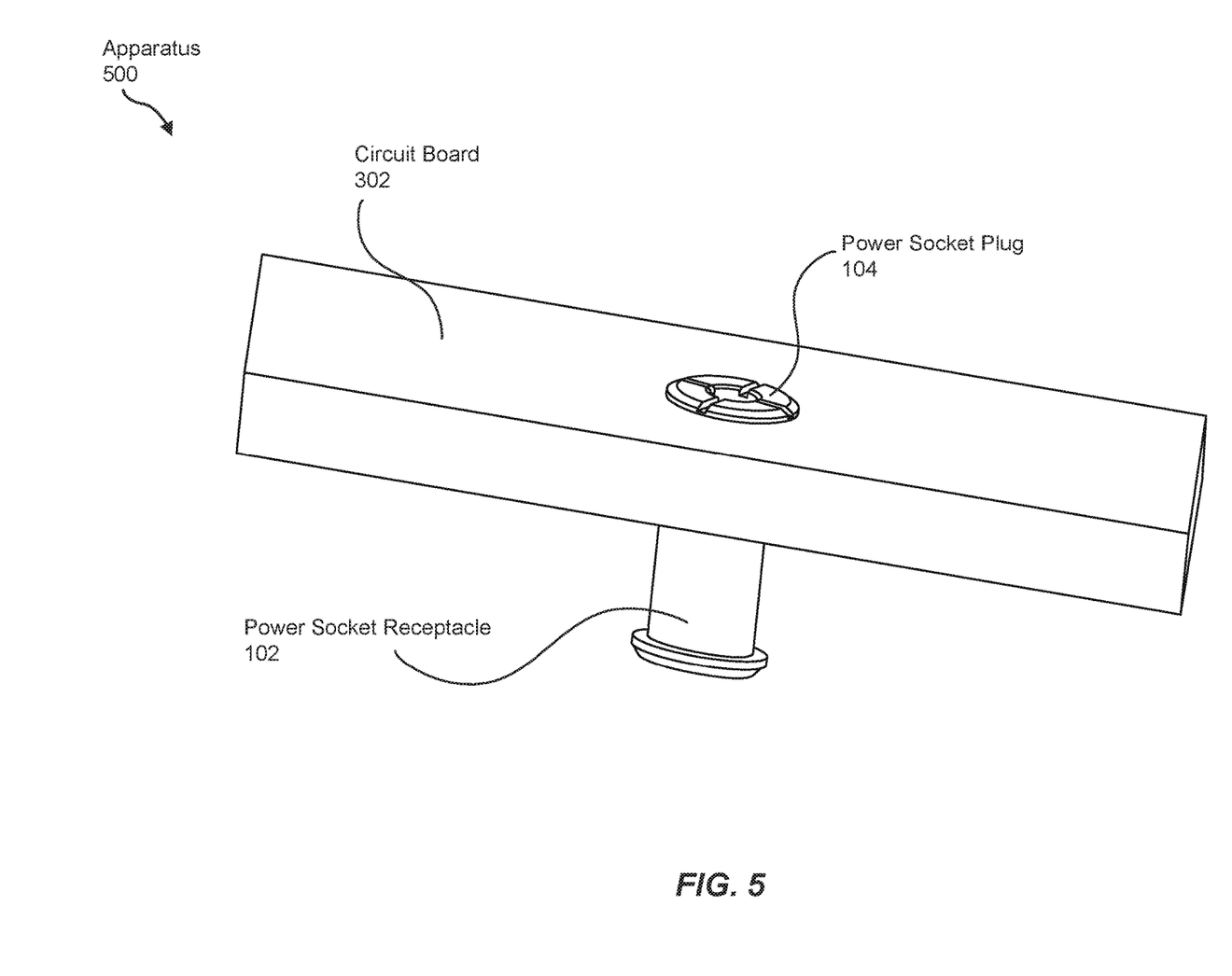
FIG. 5 is an illustration of an exemplary apparatus for achieving PCB-compatible power sockets.

FIGS. 3-5 illustrates exemplary apparatuses 300, 400, and 500, respectively, for achieving PCB-compatible power sockets. As illustrated in FIGS. 3-5, exemplary apparatuses 300, 400, and 500 may each include and/or represent power socket receptacle 102, power socket plug 104, and a circuit board 302. In particular, FIGS. 3-5 may represent and/or demonstrate an exemplary progression of installing and/or assembling a power socket (e.g., power socket receptacle 102 and power socket plug 104) in a via 304 of circuit board 302.

Circuit board 302 generally represents to any type or form of insulating material that facilitates mounting (e.g., mechanical support) and/or interconnection (e.g., electrical coupling) of electrical and/or electronic components. In one example, circuit board 302 may include and/or represent a PCB. Examples of circuit board 302 include, without limitation, single-sided boards, double-sided boards, multilayer boards, motherboards, linecards, backplanes, midplanes, and/or any other suitable type of circuit board. Various components may be laminated, etched, attached, and/or otherwise coupled to circuit board 302.

In some examples, circuit board 302 may include various electrically conductive layers (not explicitly illustrated in FIGS. 3-5). In one example, each layer may include and/or represent a copper plane that is etched during the fabrication phase to produce various copper traces throughout circuit board 302. In this example, the etched copper traces may be separated from and/or interconnected with one another as necessary to form one or more circuits that incorporate electrical components and/or electronics across circuit board 302.

Via 304 generally represents any type or form hole and/or channel that is cut, drilled, and/or formed in and/or through a circuit board. In one example, via 304 may be plated with conductive material that electrically bridges certain layers of circuit board 302 during the fabrication phase. Alternatively, via 304 may remain unplated after the fabrication phase such that additional conductive material (from, e.g., power socket receptacle 102 and/or power socket plug 104) is needed to electrically bridge such layers of circuit board 302. In any case, via 304 may be sized and/or designed to accept and/or hold a power socket. In other words, via 304 may be sized and/or designed for the installation of such a power socket.

As illustrated in FIGS. 3-5, power socket receptacle 102 may be installed and/or inserted into one side of via 304 on circuit board 302. For example, a human technician and/or robotic device may press the head of power socket receptacle 102 into the underside of via 304 on circuit board 302 until the head of power socket receptacle 102 reaches the topside of via 304 and/or a stopper (not explicitly labelled in FIGS. 3-5) on power socket receptacle 102 abuts the underside of circuit board 302.

As further illustrated in FIGS. 3-5, power socket plug 104 may be installed and/or inserted into a different side of via 304 on circuit board 302. For example, the human technician and/or robotic device may screw and/or twist the body of power socket plug 104 into the head of power socket receptacle 102, thereby forming a power socket across and/or throughout via 304. This screwing and/or twisting may fasten and/or couple female thread 106 and male thread 108 together to secure the power socket to circuit board 302 at via 304. In one example, a head on power socket plug 104 (not explicitly labelled in FIGS. 3-5) and the stopper on power socket receptacle 102 may effective fix and/or hold the power socket in place on circuit board 302 at via 304.

In some examples, the fastening mechanism of female thread 106 and male thread 108 may enable power socket receptacle 102 and power socket plug 104 to join in via 304 without necessitating the same amount of force as traditional power sockets (such as press-fit power sockets). Such force has been known to damage the corresponding PCBs, thereby increasing manufacturing costs. As a result, the fastening mechanism of female thread 106 and male thread 108 may mitigate and/or decrease the risk of damaging the structural and/or electrical integrity of circuit board 302 and/or the risk of causing a short circuit.

Additionally or alternatively, the fastening mechanism of female thread 106 and male thread 108 may mitigate and/or negate the need for the same tight and/or restrictive tolerances required by traditional power sockets (such as press-fit power sockets). As a result, the fastening mechanism of female thread 106 and male thread 108 may facilitate an easier, more cost-effective process for assembling and/or installing threaded power sockets in circuit board 302 when compared to traditional processes.

Figure 6:
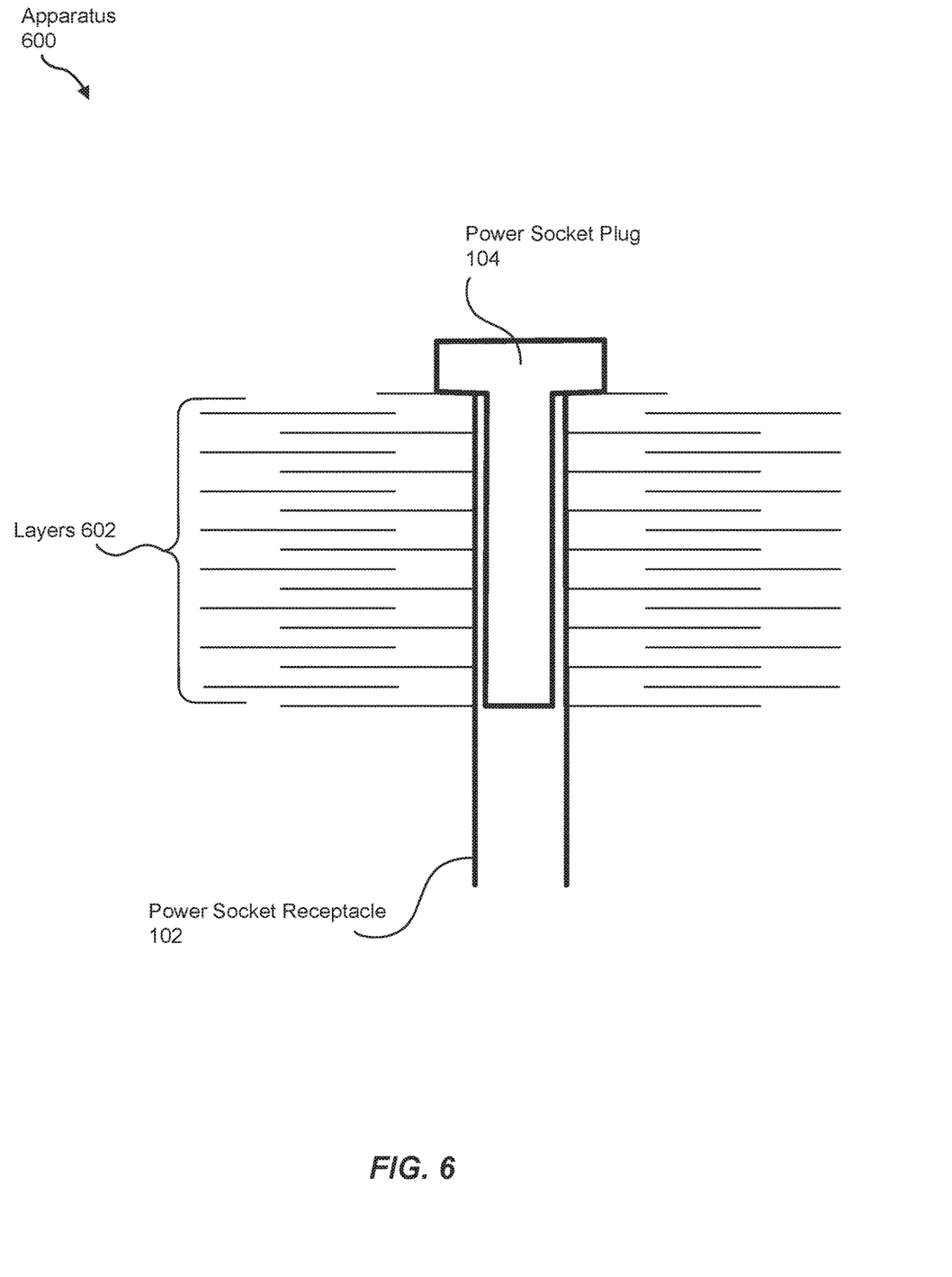
FIG. 6 is an illustration of an exemplary apparatus for achieving PCB-compatible power sockets.

FIG. 6 illustrates a cross-section of an exemplary apparatus 600 for achieving PCB-compatible power sockets. As illustrated in FIG. 6, exemplary apparatus 600 may include and/or represent power socket receptacle 102 and power socket plug 104 fastened together within a via of a circuit board (not explicitly labelled in FIG. 6). In one example, the circuit board may include and/or contain layers 602 that interface with one another at the via. In this example, power socket receptacle 102 and power socket plug 104 may individually or collectively provide electrical continuity throughout and/or across at least some of layers 602 on the circuit board.

As illustrated in FIG. 6, layers 602 may be located fairly close to one another within the circuit board. In one example, layers 602 may be separated from one another by a dielectric and/or insulative material within the circuit board. As a result, the application of too much force may cause the dielectric and/or insulative material to break down and/or collapse such that certain traces etched into layers 602 short and/or cross where they are supposed to remain separated and/or isolated from one another. This shorting and/or crossing of layers 602 may ruin the corresponding circuit(s) laid out on the circuit board. However, the fastening mechanism of female thread 106 and male thread 108 may effectively prevent such break down and/or collapse from happening by enabling power socket receptacle 102 and power socket plug 104 to securely join in via 304 without necessitating that much force.

Figure 7:
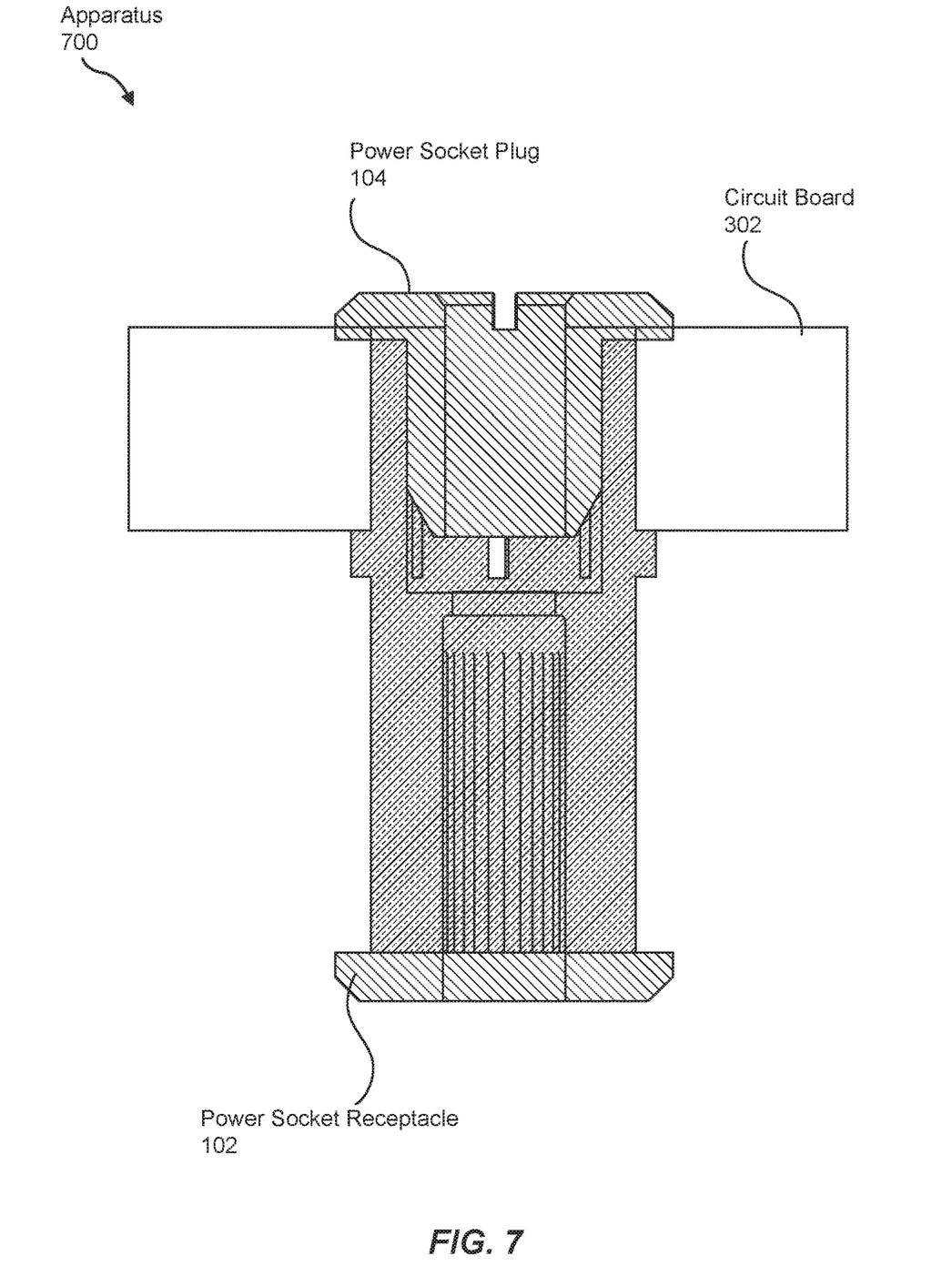
FIG. 7 is an illustration of an exemplary apparatus for achieving PCB-compatible power sockets.

FIG. 7 illustrates an exemplary apparatus 700 for achieving PCB-compatible power sockets. As illustrated in FIG. 7, exemplary apparatus 700 may include and/or represent power socket receptacle 102, power socket plug 104, and circuit board 302. In this example, power socket receptacle 102 and power socket plug 104 may be screwed together inside via 304 (not explicitly labelled in FIG. 7) of circuit board 302. As a result, power socket receptacle 102 and power socket plug 104 may be securely fixed and/or held to circuit board 302 at via 304.

Figure 8:
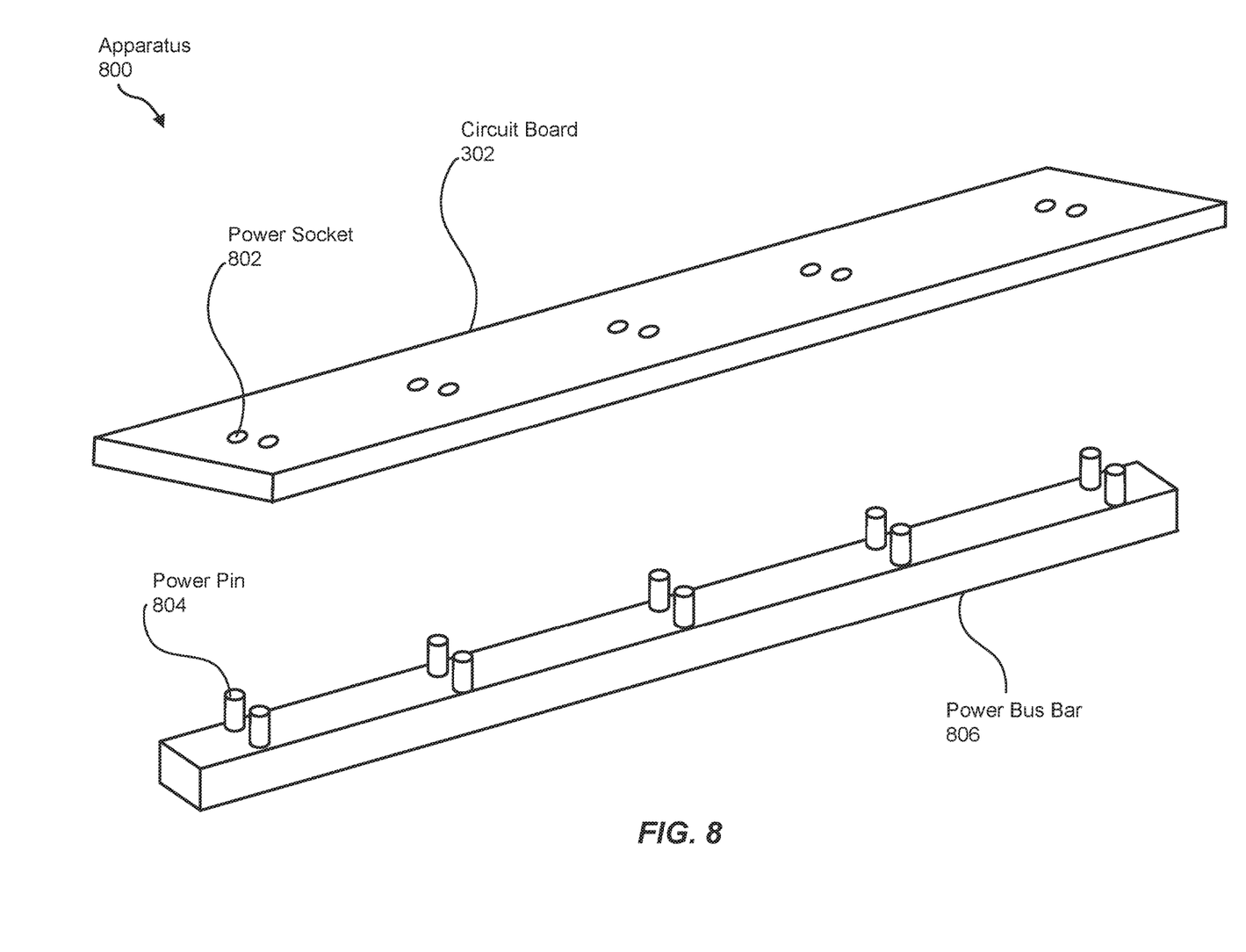
FIG. 8 is an illustration of an exemplary apparatus for achieving PCB-compatible power sockets.

FIG. 8 illustrates an exemplary apparatus 800 for achieving PCB-compatible power sockets. As illustrated in FIG. 8, exemplary apparatus 800 may include and/or represent circuit board 302 and a power bus bar 806. In one example, circuit board 302 may include a power socket 802 installed and/or assembled into a via (not explicitly labelled in FIG. 8) on circuit board 302. In this example, power socket 802 may include and/or represent the combination of receptacle 102 and plug 104. Circuit board 302 may also include various additional power sockets (not explicitly labelled in FIG. 8) installed and/or assembled into additional vias on circuit board 302.

In one example, power bus bar 806 may include and/or incorporate a power pin 804 that interfaces and/or mates with power socket 802. In this example, power pin 804 may enter and/or be installed, inserted, or locked into an opening of power socket 802. Power socket 802 and power pin 804 may thus form and/or constitute a power or electrical coupling the enables electrical power to flow and/or transfer from power bus bar 806 to circuit board 302. Power bus bar 806 may also include various additional power pins (not explicitly labelled in FIG. 8) that interface and/or mate with the additional power sockets on circuit board 302.

Accordingly, power bus bar 806 may be electrically connected to a power source that provides electrical power to circuit board 302. In this example, power bus bar 806 may carry the electrical power to circuit board 302 by way of power pin 804, which is installed into power socket 802 at via 304 of circuit board 302. Thus, power socket 802, power pin 804, and power bus bar 806 may collectively form all or part of a power distribution system. As will be described in greater detail below, such a power distribution system may be deployed in a network device that forwards traffic within a network and/or across networks.

Figure 9:
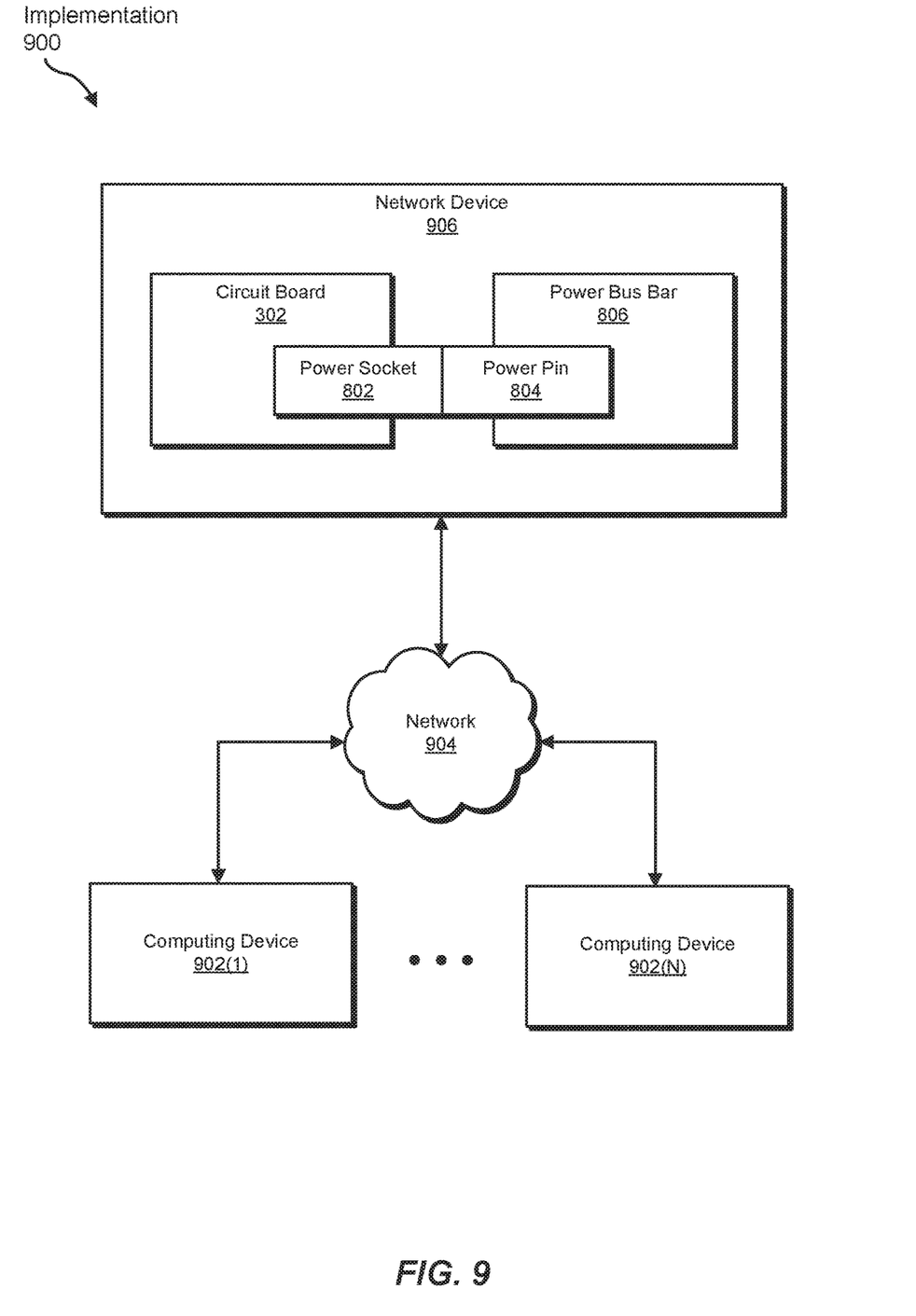
FIG. 9 is an illustration of an exemplary implementation of an apparatus for achieving PCB-compatible power sockets.

FIG. 9 illustrates an exemplary implementation 900 of an apparatus for achieving PCB-compatible power sockets. As illustrated in FIG. 9, exemplary implementation 900 may include and/or represent a network device 906 in communication with computing devices 902(1)-(N) via a network 904. In one example, network device 906 may include and/or incorporate a power distribution system that distributes electrical power to the various electrical components and/or electronics that facilitate forwarding traffic to computing devices 902(1)-(N) via network 904. This power distribution system may include and/or represent power socket 802, power pin 804, and power bus bar 806. In this example, power bus bar 806 may carry and/or provide electrical power to circuit board 302 via the interface formed by power pin 804 and power socket 802.

Network device 906 generally represents any type or form of physical computing device capable of reading computer-executable instructions and/or handling network traffic. In one example, network device 202 may include and/or represent a router (such as a provider edge router, a hub router, a spoke router, an autonomous system boundary router, and/or an area border router). Additional examples of network device 906 include, without limitation, switches, hubs, modems, bridges, repeaters, gateways, multiplexers, network adapters, network interfaces, laptops, tablets, desktops, servers, multimedia players, embedded systems, gaming consoles, variations or combinations of one or more of the same, and/or any other suitable network device.

Figure 10:
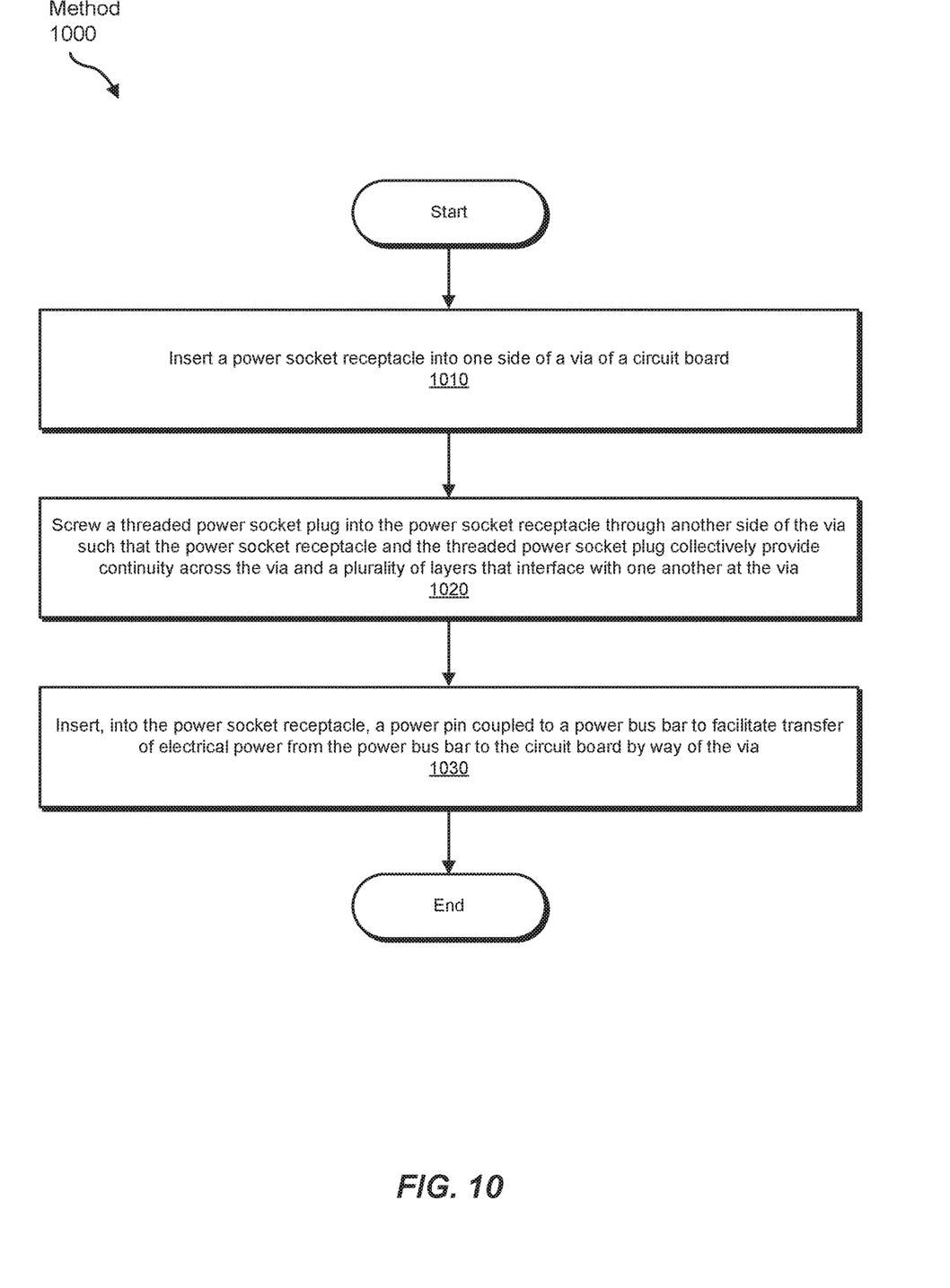
FIG. 10 is a flow diagram of an exemplary method for achieving PCB-compatible power sockets.

FIG. 10 is a flow diagram of an exemplary method 1000 for achieving PCB-compatible power sockets. Method 1000 may include the step of inserting a power socket receptacle into one side of a via of a circuit board (1010). Step 1010 may be performed in a variety of ways, including any of those described above in connection with FIGS. 1-9. For example, a computing equipment manufacturer or subcontractor may insert power socket receptacle 102 into the bottom of via 304 on circuit board 302.

Method 1000 may also include the step of screwing a threaded power socket plug into the power socket receptacle through another side of the via such that the power socket receptacle and the power socket plug collectively provide continuity across the via and a plurality of layers that interface with one another at the via (1020). Step 1020 may be performed in a variety of ways, including any of those described above in connection with FIGS. 1-9. For example, the computing equipment manufacturer or subcontractor may screw power socket plug 104 into power socket receptacle 102 through the top of via 304.

Method 1000 may further include the step of inserting, into the power socket receptacle, a power pin coupled to a power bus bar to facilitate transfer of electrical power from the power bus bar to the circuit board by way of the via (1030). Step 1030 may be performed in a variety of ways, including any of those described above in connection with FIGS. 1-9. For example, the computing equipment manufacturer or subcontractor may insert power pin 804 into the corresponding opening in power socket receptacle 102. In this example, power pin 804 may be coupled to power bus bar 806. The insertion of power pin 804 into power socket receptacle 102 may facilitate the transfer of electrical power from power bus bar 806 to circuit board 302 by way of via 304.

While the foregoing disclosure sets forth various embodiments using specific block diagrams, flowcharts, and examples, each block diagram component, flowchart step, operation, and/or component described and/or illustrated herein may be implemented, individually and/or collectively, using a wide range of hardware, software, or firmware (or any combination thereof) configurations. In addition, any disclosure of components contained within other components should be considered exemplary in nature since many other architectures can be implemented to achieve the same functionality.

The process parameters and sequence of the steps described and/or illustrated herein are given by way of example only and can be varied as desired. For example, while the steps illustrated and/or described herein may be shown or discussed in a particular order, these steps do not necessarily need to be performed in the order illustrated or discussed. The various exemplary methods described and/or illustrated herein may also omit one or more of the steps described or illustrated herein or include additional steps in addition to those disclosed.

The preceding description has been provided to enable others skilled in the art to best utilize various aspects of the exemplary embodiments disclosed herein. This exemplary description is not intended to be exhaustive or to be limited to any precise form disclosed. Many modifications and variations are possible without departing from the spirit and scope of the instant disclosure. The embodiments disclosed herein should be considered in all respects illustrative and not restrictive. Reference should be made to the appended claims and their equivalents in determining the scope of the instant disclosure.

Unless otherwise noted, the terms "connected to" and "coupled to" (and their derivatives), as used in the specification and claims, are to be construed as permitting both direct and indirect (i.e., via other elements or components) connection. In addition, the terms "a" or "an," as used in the specification and claims, are to be construed as meaning "at least one of." Finally, for ease of use, the terms "including" and "having" (and their derivatives), as used in the specification and claims, are interchangeable with and have the same meaning as the word "comprising."

What is claimed is:

1. An apparatus comprising:
   a power socket receptacle that:
      fits within an unplated via of a circuit board that includes a plurality of electrically conductive layers that:
         interface with one another at the unplated via; and
         are physically separated from one another by a dielectric material; and
      is inserted into the circuit board through one side of the unplated via; and
   a power socket plug that:
      fits within the power socket receptacle; and
      is screwed into the power socket receptacle through another side of the unplated via such that the power socket receptacle and the power socket plug collectively provide electrical continuity to the plurality of electrically conductive layers across the unplated via even though the via is unplated and the electrically conductive layers are physically separated from one another.

2. The apparatus of claim 1, wherein:
   the power socket receptacle comprises a female thread; and
   the power socket plug comprises a male thread that mates with the female thread of the power socket receptacle to enable the power socket plug to screw into the power socket receptacle.

3. The apparatus of claim 1, wherein:
   the power socket receptacle comprises a male thread; and
   the power socket plug comprises a female thread that mates with the male thread of the power socket receptacle to enable the power socket plug to screw into the power socket receptacle.

4. The apparatus of claim 1, wherein the power socket plug secures the power socket receptacle to the circuit board at the unplated via.

5. The apparatus of claim 1, wherein the screwing of the power socket plug into the power socket receptacle secures the power socket receptacle to the circuit board at the via without damaging the circuit board.

6. The apparatus of claim 1, wherein the power socket receptacle and the power socket plug each include at least one electrically conductive material.

7. The apparatus of claim 1, further comprising a power pin that:
   fits within an opening of the power socket receptacle; and
   is inserted into the power socket receptacle to facilitate transfer of electrical power from the power pin to the circuit board by way of the via.

8. The apparatus of claim 7, further comprising a power bus bar that:
   incorporates the power pin that is inserted into the power socket receptacle; and
   carries the electrical power transferred to the circuit board by way of the via.

9. The apparatus of claim 8, wherein the power socket receptacle, the power socket plug, the power pin, and the power bus bar collectively form a power distribution system of a network device that facilitates forwarding traffic within a network.

* * * * *